United States Patent [19]

Johnson

[11] Patent Number: 5,183,724

[45] Date of Patent: Feb. 2, 1993

[54] METHOD OF PRODUCING A STRIP OF LEAD FRAMES FOR INTEGRATED CIRCUIT DIES IN A CONTINUOUS SYSTEM

[75] Inventor: Frank J. Johnson, Santa Cruz, Calif.

[73] Assignee: Amkor Electronics, Inc., West Chester, Pa.

[21] Appl. No.: 629,440

[22] Filed: Dec. 18, 1990

[51] Int. Cl.⁵ .................. G03C 5/00; H01L 21/60
[52] U.S. Cl. .................. 430/312; 430/318; 205/128; 205/138; 205/129; 437/206; 437/220
[58] Field of Search .............. 430/312, 318, 320, 323, 430/22; 437/206, 220; 174/52.4; 205/129, 138, 128

[56] References Cited

U.S. PATENT DOCUMENTS

| | | | |
|---|---|---|---|
| 3,945,826 | 3/1976 | Friedman et al. | 430/323 |
| 4,065,851 | 1/1978 | Kummer et al. | 437/206 |
| 4,208,242 | 6/1980 | Zampiello | 430/323 |
| 4,227,983 | 10/1980 | Gursky et al. | 430/312 |
| 4,367,123 | 1/1983 | Beck | 204/224 |
| 4,410,562 | 10/1983 | Nemoto et al. | 430/312 |
| 4,435,498 | 3/1984 | Baillie | 430/318 |
| 4,512,843 | 4/1985 | Miyazaki | 430/312 |
| 4,645,732 | 2/1987 | Young | 430/318 |
| 4,878,990 | 11/1989 | Dugan et al. | 437/220 |
| 5,032,542 | 7/1991 | Kazami et al. | 174/52.4 |

FOREIGN PATENT DOCUMENTS

| | | | |
|---|---|---|---|
| 61-187261 | 8/1986 | Japan | 437/220 |
| 61-236147 | 10/1986 | Japan | 437/220 |
| 1-137659 | 8/1989 | Japan | 437/220 |
| 2-281749 | 11/1990 | Japan | 437/220 |
| 2172430 | 9/1986 | United Kingdom | 437/206 |

*Primary Examiner*—Charles L. Bowers, Jr.
*Assistant Examiner*—Martin Angebranndt
*Attorney, Agent, or Firm*—John F. A. Earley; John F. A. Earley, III

[57] ABSTRACT

Lead frames for microchips and other integrated circuit dies are produced by a continuous manufacturing method and apparatus in which silver spot plating is done prior to etching away unwanted portions of the lead frame substrate. A flexible substrate of a metal alloy is fed continuously from a reel, then spot plated with silver, coated with a photosensitive material, and exposed to intensive light in an exposure chamber using a photoresist or masking tool of predetermined design. The exposed photosensitive material is developed chemically, etched in acid, and placed in a chemical solution to remove any remaining unwanted material. The strip is then dried, cut to predetermined lengths and boxed for shipment. If necessary, the strip is downset and taped before packaging. In a presently preferred process, the metal alloy substrate is 42 alloy (Fe+Ni), and the selective spot plating is silver 100 to 150 microinches thick. The silver does not dissolve in the etchants and therefore has to be removed from exposed areas, preferably by "reverse" plating techniques.

12 Claims, 2 Drawing Sheets

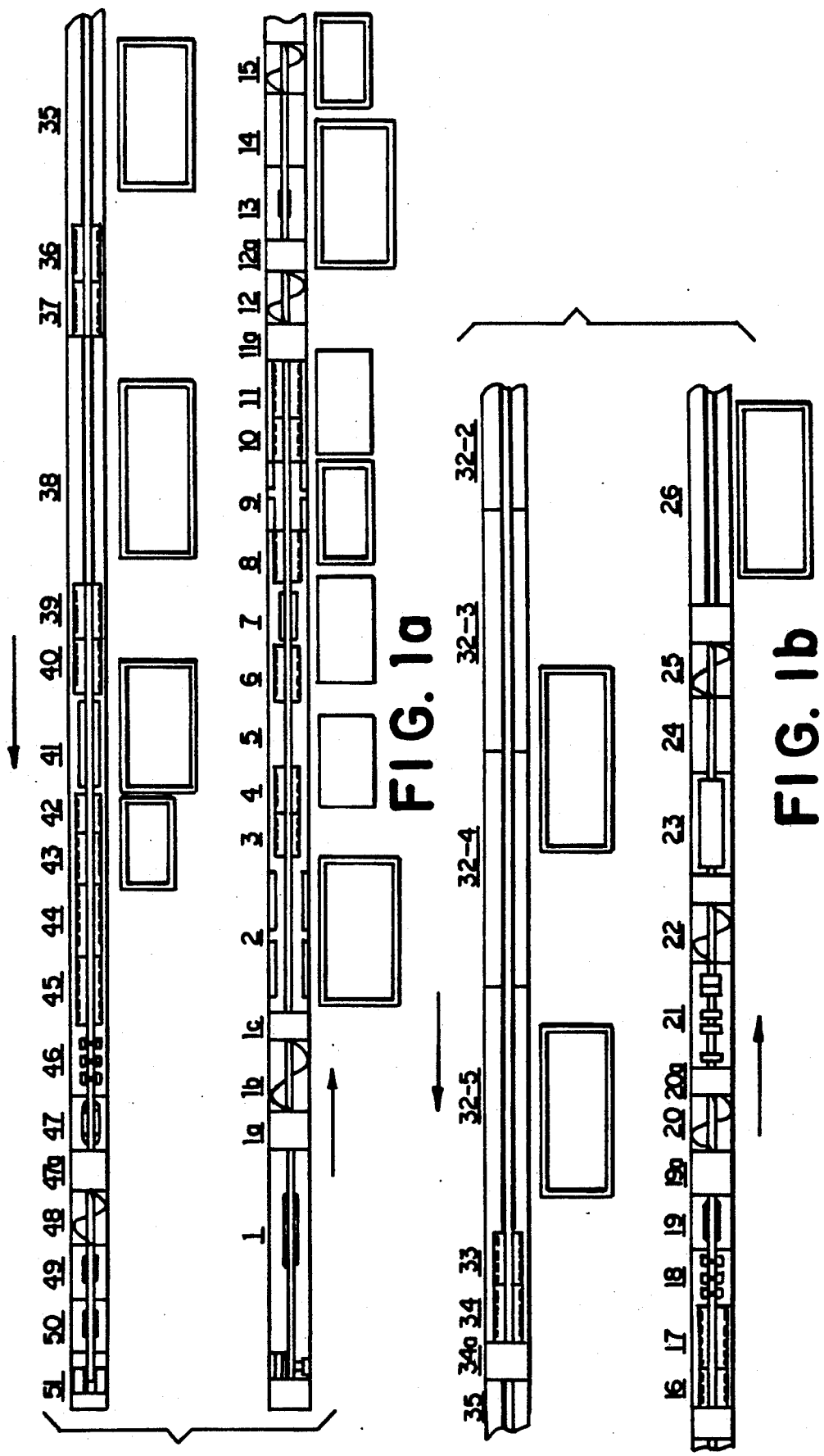

METHOD OF PRODUCING A STRIP OF LEAD FRAMES FOR INTEGRATED CIRCUIT DIES IN A CONTINUOUS SYSTEM

BACKGROUND OF THE INVENTION

This invention relates to the production of lead frames for microchips and similar integrated circuit dies, and more particularly concerns a method and apparatus for automatically and continuously producing a strip of lead frames.

DESCRIPTION OF THE PRIOR ART

Lead frames for integrated circuit dies, such as microchips, have not heretofore been produced in a single continuous manufacturing method or machine. For example, in prior art methods it has been the practice to perform the plating step in a single operation which is performed after the lead frame has been manufactured (etched). In the system of the invention, a preplating step takes place before the lead frame is formed (etched).

SUMMARY OF THE INVENTION

An important object of the present invention is to produce a strip of lead frames in a single continuous process and machine. It is a feature of the present invention that functional areas of a continuous strip are preplated prior to removing unwanted areas from the strip by etching.

It is another feature of the present invention that slack is introduced at several positions into the continuously fed strip so that the strip may be stopped at or near those positions to permit work to be performed thereon.

An important advantage of the system of the present invention is that the time of the manufacturing process is greatly reduced, for example from days to less than an hour, and in a specific presently preferred method to about twenty minutes.

Another advantage is that the continuous process is repeatable resulting in a significant increase in quality and a reduction or elimination of error by avoiding multiple handling of the work product.

Apparatus is provided for producing lead frames for microchips or integrated circuit dies in a continuous process. In a presently preferred machine, the apparatus includes: means for feeding continuously a strip of flexible platable metal material which serves as a substrate; means for applying a copper strike to the substrate; means for selectively spot plating the substrate with silver at predetermined precise locations; means for laminating a photosensitive film onto both faces of the silver plated substrate; means for positioning a specific opaque design in registry on both faces of the laminated substrate; means for exposing to high intensity light the photosensitive film; means for developing the film; means for washing away the non-exposed portion of the film and keeping the portion of the film which has been exposed to light and developed; means for removing the thus exposed silver metal plating from the surface of the substrate; and means for etching away the areas of substrate which are exposed when the non-exposed portion of the film is washed away. All of the forgoing means perform their respective work on the substrate as it moves continuously through the apparatus. By providing slack areas, movement of the substrate may be stopped momentarily at certain positions to permit work to be done thereon, for example, when the spot silver plating is applied and when the film is exposed in the exposure chamber, all without interrupting the continuous feed of the strip from a reel or other source.

DETAILED DESCRIPTION

Figure 1C:
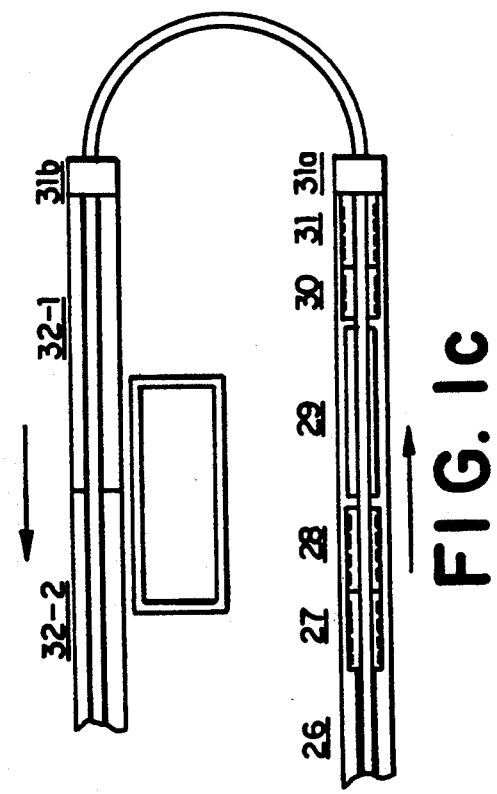
FIG. 1, (which comprises FIGS. 1(a), 1(b) & 1(c)) is a diagrammatic illustration of one form of apparatus constructed according to the present invention.

Referring now to FIG. 1, reference numeral 1 identifies a feed or pay-out station or zone 1 which is a mechanical-electronic handling machine for feeding a strip of metal substrate material from coils at a rate of 50 to 200 inches per minute. The feed rate is adjustable to accommodate the width of strip, the size of the arbor of reel, and the desired speed of delivery. This type of feed system is available commercially from various manufacturers, and may be obtained, for example, from Sung Je Co., 705-716 Kuro 2 Dong, Kuro-Ku, Seoul, South Korea. The apparatus used in the present invention is a commercial machine modified to meet the particular needs of the present application.

The strip or substrate material may be an alloy of iron and nickel, preferably 42 alloy (Fe + Ni), but may be any platable metal or flexible circuit material used in what is known as "flex circuits", especially copper and alloys of copper.

Reference numeral 2 identifies an electrocleaning station or zone 2 at which the substrate is electrocleaned, preferably by an alkaline based solution. This station 2 cleans oil, soil, and dirt from the substrate material.

Located between stations 1 and 2 is a power roller 1a, slack apparatus 1b, and a guide roller 1c. Here slack is introduced into the continuously fed substrate. The purpose of introducing slack at this point is to allow for joining the back end of the substrate of a preceding reel to the front end of the substrate of a following reel. The feed mechanism stops when the reel of material runs out. After joining the material of the two reels, the feed is restarted.

Following station 2, at which the strip or substrate is electrocleaned, the strip is given a cold tap water rinse (CTWR) at stations 3 and 4 to remove chemicals from the surface of the strip. The electrocleaner is alkaline and must be removed prior to the microetch which is acidic. Next, the strip is microetched at station 5 by a chemical, preferably acidic, to produce a microetch on the surface of the substrate material. The purpose of the microetch is to roughen the surface and to increase the surface area thereby to promote adhesion of the subsequently applied photosensitive mask material and also to promote adhesion of the encapsulation material which is applied to the lead frame after the chip or integrated circuit die is placed into position and bonded onto the lead frame. After passing through the microetch station 5, the strip is subjected to a cold deionized water rinse (CDIR) at station 6 to remove any chemical from the surface and to lessen the contaminants which could cause problems in the next zone. Next, at station 7, the strip is subjected to acid activation, preferably by hydrochloric acid, to chemically remove any oxides from the surface and grain boundaries. The grain boundaries are areas between the grains of metal. The strip is then given another cold deionized water rinse (CDIR) at station 8.

Following station 8, the strip is subjected to a copper strike at station 9 the purpose of which is to promote the adhesion of subsequently applied additional plating to the substrate. The copper plated strip has a thickness of five to ten microinches. This copper strike is more important to substrates of iron alloys but may also be used on copper material in that it acts as a cleaner.

At the next or drag-out (D.O.) station 10, the substrate is subjected to a spray rinse to lessen the amount of contaminant in the machine's effluents. The drag-out system is composed of a spray cell and a reservoir. It is a closed system with no access to the effluent system. It is called a drag-out because it drags out and captures chemicals and metals. Next, at station 11, the substrate is subjected to a cold deionized water rinse (CDIR).

Power rollers 11a and 12a then put slack into the strip at station 12. Power rollers 11a and 12a are synchronized. The slack in the material is predetermined. The rollers maintain the slack in the substrate material in zone 12. The power rollers are controlled by a mechanical-electronic unit which moves the strip material at a given rate through the apparatus. Slack areas at 12 and 15 are necessary because the silver spot plating apparatus at station 13 is a register-stop-register machine.

At station 13, the substrate is selectively spot plated with silver using a mask of predetermined design. While silver is preferred, gold or other platable metal may be used. The thickness of the plating is 100 to 150 microinches. The equipment at station 14 includes registration apparatus which places the substrate in precise position for plating. The plating cycle is as follows: register the strip; close the plating mask; turn on the chemical pump to move silver solution from 80 gallon reservoir to the plating mask cell; turn on direct current (DC) for 2-5 seconds; turn off DC; turn off pump; open mask; register. The spot plating cycle takes place in a total time of 6-12 seconds, dependent upon required thickness of silver.

Following the silver spot plating at stations 13 and 14, the spot plated substrate moves through a mechanical-electronic slack and drag out station 15. This equipment is similar to that at station 12. Next, at stations 16 and 17, the silver plated substrate is subjected to a cold deionized water rinse similar to that at station 11 but longer to guarantee that the material is free of all traces of chemicals which, if present, would interfere with adhesion.

At the next station 18 the substrate passes through an air knives machine which blows liquid off all of the surfaces of the substrate including its plated areas. This apparatus uses jets of clean dry compressed air to break up the adhesion of the aqueous film to the metal.

The next station 19 is a drying station where forced hot air is directed at the strip from heat guns which may be of the hair dryer type. These guns are designed to completely dry the strip material whether it is moving at a low speed of 50 inches per minute or at a much higher speed, as high as 200 inches per minute. At slack station 20, the strip runs through material movement apparatus similar to that at slack stations 12 and 15. Power rollers 19a put slack into the strip, and nonpowered guide rollers 20a guide and align the strip.

Next, at station 21, the strip is laminated with a photosensitive film material. The basic laminating equipment is commercially available in a unit sold under a trademark DYNA-CHEM by Western Magnum Corp., 600 Fairport Street, Elsegundo, Calif. 90245. The basic unit was engineered to meet the requirements of the system of the invention. This unit feeds dry photomask film material through a series of rollers to apply the film simultaneously to both faces of the metal substrate. While dry photomask film is used in the presently preferred apparatus, the method is also adaptable to wet film apparatus. The strip at slack station 22 passes through additional material movement apparatus similar to those at slack stations 12, 15 and 20 to introduce slack into the strip and to guide it. The strip is not stopped in the laminating zone 21. The purpose of the slack zones 20 and 22 is to allow time for joining the end of one roll of dry laminating film to the next roll without shutting down the machine. The dry film comes in a roll 1000 feet long and is depleted every two hours.

Station 23 is an exposure chamber where a matched set of glass plates which have a specific opaque design are aligned simultaneously with the strip and with each other. The strip is placed in the exposure chamber 23 in a precise position or as nearly precise as is possible by the registration equipment at station 24. The two glass plates are closed upon the stopped film-coated substrate, the shutters are opened and the strip is exposed to a high intensity light. The shutters are then closed and the glass plates opened, i.e. retracted from the substrate. Those areas of film which were exposed are retained in the development chemistry. Unexposed areas are washed away, leaving any unwanted silver or copper plating on the substrate exposed to later applied etch solutions. After the glass masks are retracted from the substrate, the registration cycle begins anew at station 24. This registration apparatus is similar to that described in connection with station 14. The function of the registration apparatus is to stop the substrate in a location related to the previously preplated silver spot. The exposure time is about 4 seconds. The full cycle takes about 7 seconds. The process in station 24 may be referred to as "negative resist"process. However, the process of the present invention may also use a "positive resist" method.

Following exposure and registration at stations 23 and 24, slack is again introduced into the substrate at station 25. The film is then developed at station 26 where the substrate is subjected to a solution designed to wash away any film not exposed to the high intensity light (negative resist). The strip then passes through a hot water rinse (HTWR) at stations 27 and 28. Hot water is used to remove all traces of developing chemical.

In the next station, 29, the exposed silver is removed from the strip by "reverse" plating, i.e. the strip is made the anode. The removed silver is reclaimed. This is a unique and important step in the continuous method of the present invention. Silver does not dissolve in the etchants and therefore the exposed silver must be removed from the areas where the unexposed film has been washed away leaving the silver exposed. In other words, the selective or spot silver plating which was applied at station 13 and which is now exposed must be removed from the surface of the substrate. If not removed, it would interfere with the etch of the substrate in subsequent processing.

At drag-out (D.O.) station 30, the substrate is subjected to a spray rinse from the 30 gallon reservoir tank to lessen the amount of contaminant in the machine's effluents. The liquid in the 30 gallon tank has a lower concentration of metals and chemicals. The substrate is then given a cold tap water rinse (CTWR) at station 31 to remove chemicals from the surface. The strip then passes through power roller 31a and guide roller 31b en route to five similar etch chambers or stations or zones 32-1 to 32-5. In these five chambers, etchant, preferably ferric chloride (FeCl3) but sometimes copper chloride (CuCl2), is sprayed upon exposed areas of substrate which is moving through the apparatus at a speed which may be as low as 50 inches per minute or as high as 100 inches per minute. Each chamber is operated independently. All five stations 32-1 to 32-5 may be operative or certain stations may be turned off, depending upon the thickness of the substrate to be removed and the design of the pattern. For example, where the material is 0.010 mil thick, an etch time of 4.5 minutes may be required. It is in the etch chambers 32-1 to 32-5 that the lead frames are formed.

Following etching, the substrate is given a hot tap water rinse (HTWR) at stations 33 and 34 for the purpose of removing residuals of the etchant from the surface. The preferred etchant is ferric chloride whose salts are readily dissolved in hot tap water. It is necessary to remove all traces of the ferric chloride as otherwise it continues to react with the substrate. Next, power roller 34a moves the strip to silver strip station 35 where silver is removed. The purpose is to remove extraneous silver from area of the substrate where the silver did not dissolve in the etchant, for example under the edges of the resist. In the etch operations in chambers 32-1 to 32-5, the etchant extends downward and sideways through the substrate leaving an overhang of insoluble silver which must be removed so as not to cause electrical failures after encapsulation. The substrate is then given additional hot tap water rinses at stations 36 and 37.

Following these rinses, the photo resist is removed from the substrate at station 38, preferably by a high pH alkaline fluid such as a solution of water and sodium hydroxide, although other photo resist removal fluids may be used according to the characteristics of the photo film. This exposes the silver which had been under the photo resist. Then the substrate is again given spray hot tap water rinses at stations 39 and 40. The water as an effluent is not recirculated.

Next, at station 41, copper is removed or stripped from the substrate where exposed. Copper under the silver is retained. At the next or drag-out (D.O.) station 42, the substrate is spray rinsed to lessen the amount of contaminants in the machine's effluents, after which the substrate is subjected to a cold deionized water rinse to remove any chemicals from its surface.

In the next stations 44 and 45, the substrate is given hot deionized water spray rinses which are disposed of. This is followed by air drying at station 46 by an air knives using jets of clean dry compressed air designed to blow liquid from all surfaces of the strip. At the next station 47, forced hot air is directed at the substrate from heat guns, and the substrate is completely dried whether it is moving at a low speed of 50 inches per minute or at a high speed of 200 inches per minute.

Figure 2:
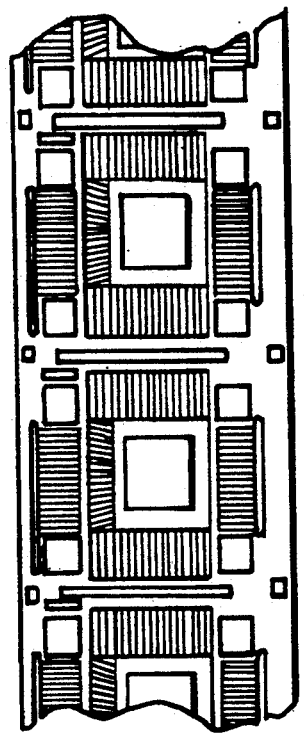
FIG. 2 illustrates a portion of a continuously delivered strip as it appears when it is near the output end of the apparatus of FIG. 1, and shows a mini strip of six lead frames.

Next, the substrate passes through power roller 47a and slack is introduced into the substrate strip at slack station 48. The strip is then cut at station 49, as for example into mini substrates of six lead frames (FIG. 2), downset at station 50, taped and packed at station 51. Apparatus for performing these functions is available commercially from Possehl HKG Precision Machining Company, located at 9-13 Wong Chuk Yeung St., Fotan, Shatin, New Territories, Hong Kong. The cut and pack operations are required, but the downset and taped operations are optional.

The continuous manufacturing apparatus and method described above has a number of features which are believed to be new and unique.

The product is produced in a continuous operation whereas in conventional apparatus the etch sheets or cut strips are produced in a separate operation. The conventional method increases handling and results in an increased number of rejects.

By using a continuous operation, the manufacturing process is reduced by days or even weeks to less than an hour, actually less than 30 minutes.

The continuous process is repeatable and results in a substantial increase in quality of product as compared with a product produced in a batch operation or in separate operations. Also, in the continuous process of the present invention, the functional areas, i.e. the lead frames, are preplated in a precise manner and at precise spot locations even though the substrate is being continuously fed from a reel, thereby avoiding the need to process cut mini strips of lead frames in a separate operation.

In zones 13 and 14, the substrate is registered so that the silver spots may be precisely placed. Units 13 and 14 are positioned in precise relationship to each other. The plating apparatus and the registration mechanism are mounted on the same stainless steel support plate to insure proper placement of the support spot.

In zones 23 and 24, the same situation exists and the exposure equipment in chamber 23 and the registration mechanism in zone 24 are mounted on a common stainless steel plate.

I claim:

1. A continuous method of automatically producing a strip of lead frames for integrated circuit dies, comprising in the following order:
    feeding continuously a flexible strip of platable metal material to serve as a substrate,
    selectively spot plating said substrate with a selected metal at predetermined precise locations,
    laminating a photosensitive film to both sides of said spot plated substrate,
    positioning a specific opaque design in registry on both sides of said laminated substrate,
    exposing to high intensity light the photosensitive film having an opaque design positioned thereon,
    applying developing chemical to said film to develop the opaque design portion of the film,
    washing away the non-exposed, non-developed portion of film to expose selected unwanted areas of the metal plating and the substrate, and
    removing said exposed metal plating and substrate to form lead frames.

2. The method according to claim 1, wherein the selected strip material is an alloy of iron and nickel.

3. The method according to claim 1, wherein in between said feeding step and said selectively spot plating step the strip material is plated with copper.

4. The method according to claim 3, wherein said removing step further includes removing any plated copper which is not covered by the developed film.

5. The method according to claim 3, including cleaning the strip of substrate just before plating with copper.

6. The method according to claim 1, wherein said removing step further comprises,
   removing a portion of the substrate under the edges of the plating so that the edges of the plating overhang the substrate,
   and then removing the overhanging edges of the plating.

7. The method according to claim 1, including adjusting the rate of feeding of the strip.

8. The method according to claim 7, including adjusting the rate of feeding of the strip between fifty and two hundred inches per minute.

9. The method according to claim 1, wherein the selected metal which is selectively spot plated onto the substrate is silver.

10. The method according to claim 1, including feeding the strip substrate continuously but stopping the strip to provide for a register-stop-register method of applying said selective spot plating.

11. A continuous method for producing a strip of lead frames for integrated circuit dies, comprising
   feeding continuously a strip of platable material for making a strip of lead frames so that the strip serves as a substrate having upper and lower faces,
   cleaning and preparing the substrate for plating with copper,
   plating both faces of the substrate with copper in a continuous manner to a thickness of 5 to 10 microinches,
   selectively silver plating the upper faces of the substrate to a thickness of 100 to 150 microinches,
   simultaneously laminating both faces of the substrate with a photosensitive film,
   exposing selected portions of the film to high intensity light and developing the exposed film which is retained on the strip as a resist film and washing away the unexposed, undeveloped film to reveal the outlines of a mini strip of six lead frames,
   removing any exposed silver from the substrate,
   removing the exposed area of the substrate by etching the substrate in $FeCl_3$,
   stripping any silver edges overhanging,
   removing the resist film,
   removing any exposed copper plating from the substrate and retaining any copper covered by the silver plating,
   rinsing the substrate clean and air drying it, and
   taping, downsetting, cutting and packing the substrate into mini strips of six lead frames.

12. A continuous method of producing a strip of lead frames for integrated circuit dies, comprising the steps of
   preplating a continuously fed substrate with silver at predetermined spot locations,
   thereafter stopping and applying to the continuously fed substrate a photo-sensitive film and a photomask having a predetermined design,
   exposing the film while the substrate is stopped but nevertheless being continuously fed to form an opaque design,
   developing the film,
   removing the film around the design to expose an unwanted portion of the silver and an unwanted portion of the substrate,
   removing said exposed silver,
   and etching away said exposed portion of the substrate to form the lead frames.

* * * * *